United States Patent
Schuelein

(10) Patent No.: US 7,659,762 B2
(45) Date of Patent: Feb. 9, 2010

(54) CLOCK SYNCHRONIZER

(75) Inventor: Mark E. Schuelein, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/729,208

(22) Filed: Mar. 27, 2007

(65) Prior Publication Data

US 2008/0239831 A1    Oct. 2, 2008

(51) Int. Cl.
*H03K 3/00* (2006.01)

(52) U.S. Cl. .................. 327/218; 327/212; 327/214

(58) Field of Classification Search ......... 327/199–203, 327/208–212, 218
See application file for complete search history.

(56) References Cited

U.S. PATENT DOCUMENTS

| | | | |
|---|---|---|---|
| 6,956,421 B1 | 10/2005 | Schuelein | |
| 7,095,255 B2 | 8/2006 | Schuelein | |
| 7,236,032 B2 | 6/2007 | Schuelein | |
| 2004/0239393 A1* | 12/2004 | Anshumali et al. | .......... 327/208 |
| 2008/0030224 A1 | 2/2008 | Dasgupta | |

* cited by examiner

*Primary Examiner*—Kenneth B Wells
*Assistant Examiner*—Daniel Rojas
(74) *Attorney, Agent, or Firm*—Erik R. Nordstrom

(57) ABSTRACT

Disclosed herein are synchronization latch solutions.

12 Claims, 2 Drawing Sheets

CLOCK SYNCHRONIZER

BACKGROUND

Synchronizing latches are used in a wide variety of applications. For example, with integrated circuit devices such as system-on-a-chip (SOC) devices and multi-core processors, signals can travel between different clock domains. When entering a different domain, they typically need to be synchronized with the different domain clock. For example, a signal may originate from flops in one clock domain (or from an asynchronous domain) and have a destination in a different clock domain. This is often associated with functions running at different frequencies but may also, for example, happen with source-synchronous data arriving at a destination running at the same frequency. In any case, synchronization is usually achieved by clocking key signals with the receiving clock through 1 or more flip flops. In such cases, the setup/hold time of the flip-flops may often be violated. At times, the flip-flop may have difficulty resolving to a '1 or a '0. This is commonly referred to as "metastability." If the metastability lasts too long, the signals may be corrupted and cause a design to fail. some solutions involve the Use of multiple, serial flip-flops to reduce the chance of failure, but unfortunately, this approach adds latency. Other approaches involve increasing transistor sizes in the flip-flop circuits to increase their responsiveness and resolve a value. Unfortunately, however, this costs power and at reduced voltages, metastability problems can dramatically increase, especially with respect to other logic performance criterion. Especially in reduced power designs, this can make synchronization challenging. Accordingly, new synchronization solutions are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Disclosed herein are improved synchronization latch embodiments that can perform well, even with reduced supply voltages (e.g., below 1.0 V). In some embodiments, they comprise an enable circuit that functions to hold the latch open when the state is in transition. They also may comprise a release component to close the latch when data is written into it.

Figure 1:
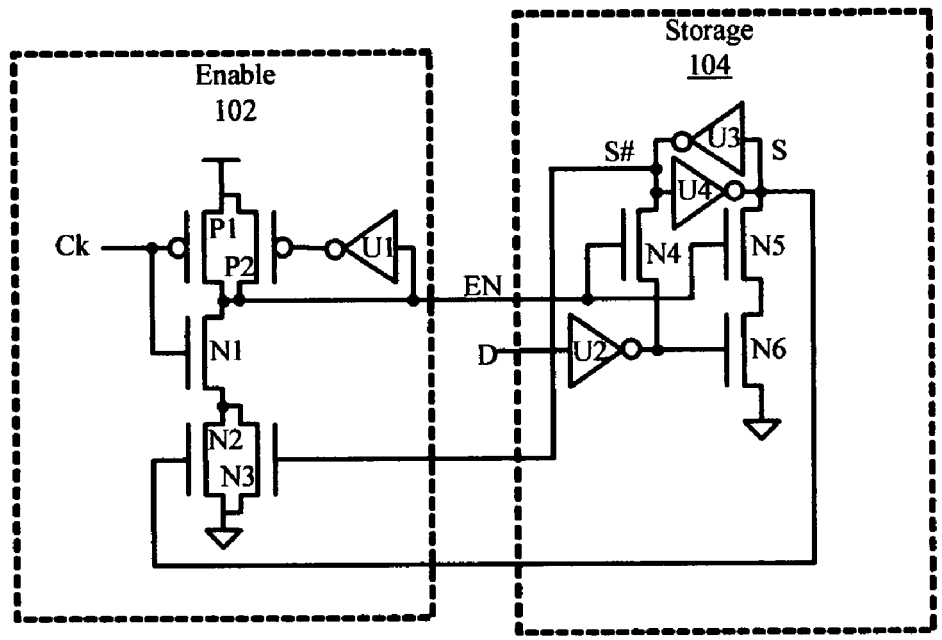
FIG. 1 is a schematic diagram of a latch in accordance with some embodiments.

FIG. 1 shows a synchronizing latch circuit in accordance with some embodiments. It generally comprises an enable circuit 102 coupled to a storage circuit 104, as shown, through an enable node (EN) and complementary state outputs (S, S#). The enable circuit comprises clock transistors P1 and N1, a hold circuit comprising pull-up transistor P2 and inverter U1, and a release circuit comprising pull-down transistors N2, N3, all coupled together as shown.

(Note that in this disclosure, an N transistor generally refers to an N-type FET and a P transistor generally refers to a P-type transistor. For example, a P-type transistor may be a PMOS transistor, and an N-type transistor may be an NMOS transistor. The term "PMOS transistor" refers to a P-type metal oxide semiconductor field effect transistor. Likewise, "NMOS transistor" refers to an N-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed.)

A clock signal (Clk) is coupled to the gate inputs of clock transistors P1 and N1 to cause the enable node to assert (High in this case) when the clock asserts (Low in this case) and to de-assert (Low) in response to the clock de-asserting (High). When the clock is Low, it turns on P1 to pull up the enable node and when it is High, N1 turns on to pull it down if either N2 or N3 are on.

The holder circuit, which comprises P2 and inverter U1, asserts when the enable node is asserted. That is, in the depicted embodiment, when EN is High, the output of U1 goes Low, which turns on P2 to "hold" EN up until it is pulled down by N2 or N3.

The gate of a first release transistor N2 is coupled to the S output node, while the second release transistor N3 is coupled to the other output node S#. The S and S# nodes will have complementary digital values with respect to each other except when they are at a so-called meta-stable state when each may be close to a midway value. Thus, either N2 or N3 will typically be on (i.e., if either S or S# is suitably asserted) to provide a virtual low-side supply reference (e.g., ground) to clock transistor N1.

The storage circuit 104 comprises cross-coupled inverters U3, U4, data inverter U2, data input transistors N4, N5 and virtual low-supply reference transistor N6, all coupled together as shown. the cross-coupled inverters U2, U3 store complementary bit values at their input/output complementary state nodes S, S#. Data input transistors N4, N5 are each controllably coupled through their gates to the enable node. When the enable node is asserted (High), they turn on to write complementary bit values into S and S#, depending on the value of the data bit (D) at the input of data inverter U2. For example, if D is '1 and EN is asserted (High or '1), then the output of U2 will go Low and pull down N4 to write a '0 into S#. The '0 output from U2 turns off N6, which causes a '1 to be written into S. Conversely, when D is '0, the output of U2 goes High, which writes a '1 into S# and turns on N6 to write a '0 into S. When the enable node is de-asserted (Low), N4 and N5 turn off, which closes the latch, i.e., holds the data at the state output nodes (S, S#).

In operation, when data is written into S, S#, the clock asserts (Low), which causes the enable node to assert (High). This turns on N4 and 5. However, data at the data input (D) may not have arrived yet, so the data transistors N4, N5 may be asked to write data into their state nodes at the very end of a clock assertion phase. This is typically when metastability issues occur. Thus, the holder circuit (U1, P2) keeps the enable node high to keep N4, N5 on, even after the clock has transitioned back to a de-assertion phase (High in this embodiment). This allows the data to properly be written into S, S# through N4 and N5.

As data is written into S, S3, the node (S or S#) that has been written High will turn on its associated release transistor (N2 or N3). This causes the holder to release the enable node placing it into a de-asserted state (Low) to properly hold the data stored in the latch. It should be appreciated that the sizes of N1, N2 and N3 should be sufficiently large, relative to P2, to pull-down the enable node against P2 after the clock is de-asserted.

Figure 2:
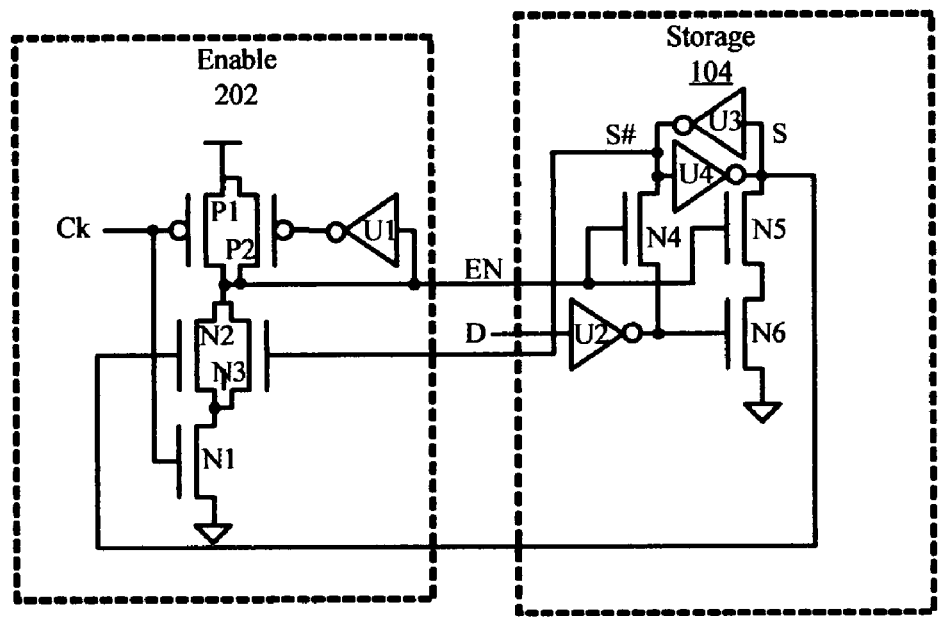
FIG. 2 is a schematic diagram of a modified embodiment of the latch of FIG. 1 in accordance with some embodiments.
Figure 3:
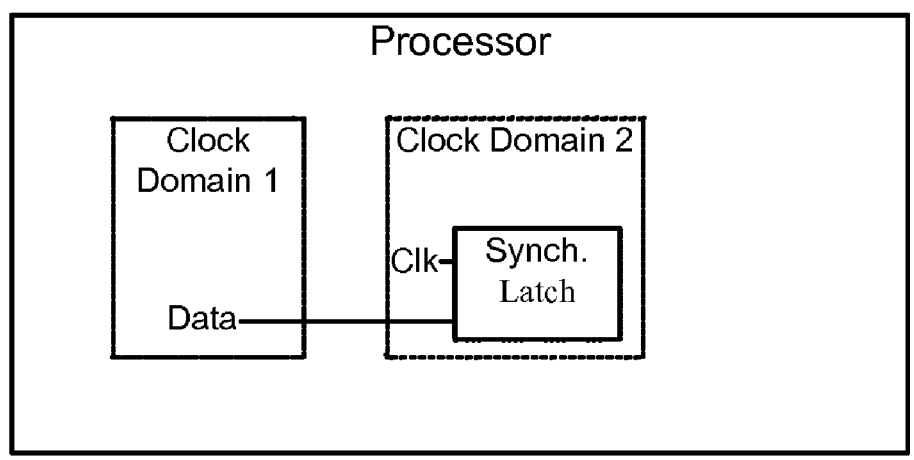
FIG. 3 shows a processor with a synchronizing latch in accordance with some embodiments.

FIG. 2 shows an alternative embodiment of the latch of FIG. 1. It is essentially the same, except that the clock transistor N1 is coupled between the release transistors and the low-supply reference instead of between the enable node and the release transistors. It has been observed that the circuit may function better with this configuration.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   a latch comprising
      a storage circuit to store data and having an enable node to enable data to be written into the storage circuit; and
      an enable circuit coupled to the enable node to assert the enable node in response to a clock assertion, the enable circuit having a hold component to hold the enable node asserted after the clock de-asserts and a release component to release the enable node from its assertion in response to data written into the storage circuit, wherein the storage circuit has complementary state outputs to indicate the stored data and wherein the release component comprises first and second transistors coupled to the enable node and having control inputs coupled to the complementary state outputs to release the enable node when data is written to the storage circuit.

2. The chip of claim 1, in which the storage circuit comprises first and second cross-coupled inverters to provide the complementary state outputs.

3. The chip of claim 1, in which the first and second transistors comprise N-type field effect transistors coupled between the enable node and a low supply reference to discharge the enable node when the data is written into it.

4. The chip of claim 3, in which the first transistor has a gate coupled to a first one of the complementary state outputs.

5. The chip of claim 4, in which the second transistor has a gate coupled to a second one of the complementary state outputs.

6. The chip of claim 3, in which the first and second N-type transistors are coupled between the enable node and a third transistor that is coupled to the low supply reference.

7. The chip of claim 1, in which the holder component comprises a transistor coupled between the enable node and a high supply reference.

8. A computer system, comprising:
   a processor having first and second clock domains and a synchronization latch in said second clock domain to synchronize data coming from the first clock domain, the synchronization latch having:
      complementary state outputs and
      an enable node to writably enable the complementary state outputs, the processor having an enable circuit coupled to the enable node to assert the enable node in response to a clock assertion, the enable circuit having a hold component to hold the enable node asserted after the clock de-asserts and a release component to release the enable node from its assertion in response to data being written into the complementary state outputs, wherein the release component comprises first and second transistors coupled to the enable node and having control inputs coupled to the complementary state outputs to release the enable node when data is written to the synchronization latch.

9. The computer system of claim 8, in which the synchronization latch comprises first and second cross-coupled inverters to provide the complementary state outputs.

10. The system of claim 8, in which the first and second transistors comprise N-type field effect transistors coupled between the enable node and a low supply reference to discharge the enable node when the data is written into it.

11. The system of claim 10, in which the first transistor has a gate coupled to a first one of the complementary state outputs.

12. The system of claim 11, in which the second transistor has a gate coupled to a second one of the complementary state outputs.

* * * * *